(12) United States Patent
Shastri et al.

(10) Patent No.: US 9,031,107 B2
(45) Date of Patent: May 12, 2015

(54) INTERPOSER CONFIGURATION WITH THERMALLY ISOLATED REGIONS FOR TEMPERATURE-SENSITIVE OPTO-ELECTRONIC COMPONENTS

(71) Applicant: Cisco Technology, Inc., San Jose, CA (US)

(72) Inventors: Kalpendu Shastri, Orefield, PA (US); Soham Pathak, Allentown, PA (US); Vipulkumar Patel, Breinigsville, PA (US); Bipin Dama, San Jose, CA (US); Kishor Desai, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/510,654

(22) Filed: Oct. 9, 2014

(65) Prior Publication Data
US 2015/0023377 A1    Jan. 22, 2015

Related U.S. Application Data

(63) Continuation of application No. 13/687,021, filed on Nov. 28, 2012, now Pat. No. 8,905,632.

(60) Provisional application No. 61/564,611, filed on Nov. 29, 2011.

(51) Int. Cl.
| H01S 3/04 | (2006.01) |
| H01S 5/00 | (2006.01) |
| H01S 5/024 | (2006.01) |
| H01S 5/022 | (2006.01) |
| H01S 5/40 | (2006.01) |

(52) U.S. Cl.
CPC ......... *H01S 5/02415* (2013.01); *H01S 5/02469* (2013.01); *H01S 5/005* (2013.01); *H01S 5/02248* (2013.01); *H01S 5/4025* (2013.01)

(58) Field of Classification Search
USPC .......................................... 372/34, 36, 50.12
See application file for complete search history.

(56) References Cited

U.S. PATENT DOCUMENTS

| 4,380,057 | A | 4/1983 | Kotecha et al. |
| 4,380,074 | A | 4/1983 | Walsh |
| 5,949,657 | A | 9/1999 | Karabatsos |
| 6,252,726 | B1 | 6/2001 | Verdiell |
| 6,603,915 | B2 | 8/2003 | Glebov et al. |
| 6,762,938 | B2 | 7/2004 | Tayebati et al. |
| 6,911,723 | B2 | 6/2005 | Akram |
| 7,327,022 | B2 | 2/2008 | Claydon et al. |
| 7,457,126 | B2 | 11/2008 | Ahrens |
| 7,539,376 | B2 | 5/2009 | Bozso et al. |
| 7,729,042 | B2 | 6/2010 | Egawa |
| 8,337,096 | B2 | 12/2012 | Shen et al. |
| 2010/0244219 | A1 | 9/2010 | Pagaila et al. |
| 2011/0210444 | A1 | 9/2011 | Jeng et al. |
| 2012/0106117 | A1 | 5/2012 | Sundaram et al. |
| 2013/0183010 | A1 | 7/2013 | Fangman et al. |

*Primary Examiner* — Armando Rodriguez
(74) *Attorney, Agent, or Firm* — Patterson & Sheridan LLP

(57) ABSTRACT

An interposer (support substrate) for an opto-electronic assembly is formed to include a thermally-isolated region where temperature-sensitive devices (such as, for example, laser diodes) may be positioned and operate independent of temperature fluctuations in other areas of the assembly. The thermal isolation is achieved by forming a boundary of dielectric material through the thickness of the interposer, the periphery of the dielectric defining the boundary between the thermally isolated region and the remainder of the assembly. A thermo-electric cooler can be used in conjunction with the temperature-sensitive device(s) to stabilize the operation of these devices.

20 Claims, 5 Drawing Sheets

INTERPOSER CONFIGURATION WITH THERMALLY ISOLATED REGIONS FOR TEMPERATURE-SENSITIVE OPTO-ELECTRONIC COMPONENTS

CROSS-REFERENCE TO RELATED APPLICATIONS

This application is a continuation of co-pending U.S. patent application Ser. No. 13/687,021, filed Nov. 28, 2012, which claims the benefit of U.S. Provisional Application No. 61/564,611, filed Nov. 29, 2011. The aforementioned related patent applications are herein incorporated by reference in their entirety.

TECHNICAL FIELD

The present disclosure relates generally to opto-electronic assemblies, particularly to the utilization of an interposer that is formed to include one or more thermally-isolated regions where temperature-sensitive devices (such as optical sources) can be located and configured to operate under controlled conditions independent of the temperature of the remainder of the assembly that is attached to the interposer.

BACKGROUND

Many packaging arrangements for opto-electronic assemblies utilize an interposer member (i.e. "carrier") as a support structure, particularly in the three-dimensional (and 2.5-dimensional) packaging architectures that are currently being developed to meet the requirements of high I/O pin-out integrated circuits and their high density routing to an associated package or board. In most cases, the interposer member comprises silicon, although glass-based interposers are used at times.

While the use of an interposer is considered to be a preferred packaging structure for allowing the integration of high speed, low power optical interfaces with necessary electronic components, the amount of heat that can be generated during the operation of the components can be problematic. Thermal management issues are of a significant concern when it is desired to integrate an optical source (e.g., laser or LED) with the other opto-electronic components, since the temperature of the area surrounding the optical source impacts the operational stability of the optical device. Various other opto-electronic components are also sensitive to changes in ambient temperature and, in particular, suffer from poor performance at elevated temperatures.

Temperature-related problems in opto-electronic packaging have been addressed in the past in a variety of different forms. For example, U.S. Pat. No. 6,252,726 issued to J-M Verdiell on Jun. 26, 2001, describes an opto-electronic package arrangement where the optical components are housed within a first package enclosure and the electrical components are housed within a second, separate package enclosure located either above or below the first package enclosure. A separate heat sink (e.g. a Peltier effect device) is attached to the arrangement and use to draw heat away from the optical components.

U.S. Pat. No. 6,762,938 issued to P. Tayebati et al. on Jul. 13, 2004 describes an arrangement for controlling the temperature of an opto-electronic package by using at least two separate thermal control systems, with one system directly controlling the operational temperature of a temperature-sensitive optical device and a second, auxiliary system controlling the temperature of the complete package.

These prior art techniques may perform well in some circumstances, but as the level of integration of optical and electrical components continues to increase, and competes with the desire to reduce the overall size of the complete opto-electronic package, the inclusion of additional temperature control systems and/or the use of separate packaging structures is not desirable. Another approach described in U.S. Pat. No. 7,327,022 issued to G. S. Claydon et al. on Feb. 5, 2008 describes a more integrated arrangement, based upon a platform technology for optical and electrical interconnections. In this arrangement, the optical components are formed on a rigid substrate and the electronics are disposed on a thermal substrate, with a gap between the two substrates used to provide thermal isolation. The thermal substrate itself functions as a heat exchanger to dissipate the heat energy created by the electronics. This arrangement still relies on the use of separate thermal paths (in this case, micropipes) for use in removing heat from the temperature-sensitive optical components.

Various other integrated structures that utilize some type of interposer in an opto-electronic arrangement create specific cavities in the interposer where heat sink devices may be located and use to dissipate the generated thermal energy. See, for example, US Patent Application Publication 2011/021044 dated Sep. 1, 2011 and US Patent Application Publication 2012/0106117 for examples of this type of arrangement.

While all of these configurations, to a greater or lesser degree, address thermal management issues in an opto-electronic assembly, the need for additional space and/or separate substrates for optics and electronics to address temperature-related issues remains a concern.

BRIEF DESCRIPTION OF THE DRAWINGS

The accompanying drawings, which are incorporated in and constitute a part of this disclosure, illustrate various embodiments of the present invention. In the drawings.

DESCRIPTION OF EXAMPLE EMBODIMENTS

Overview

Figure 1:
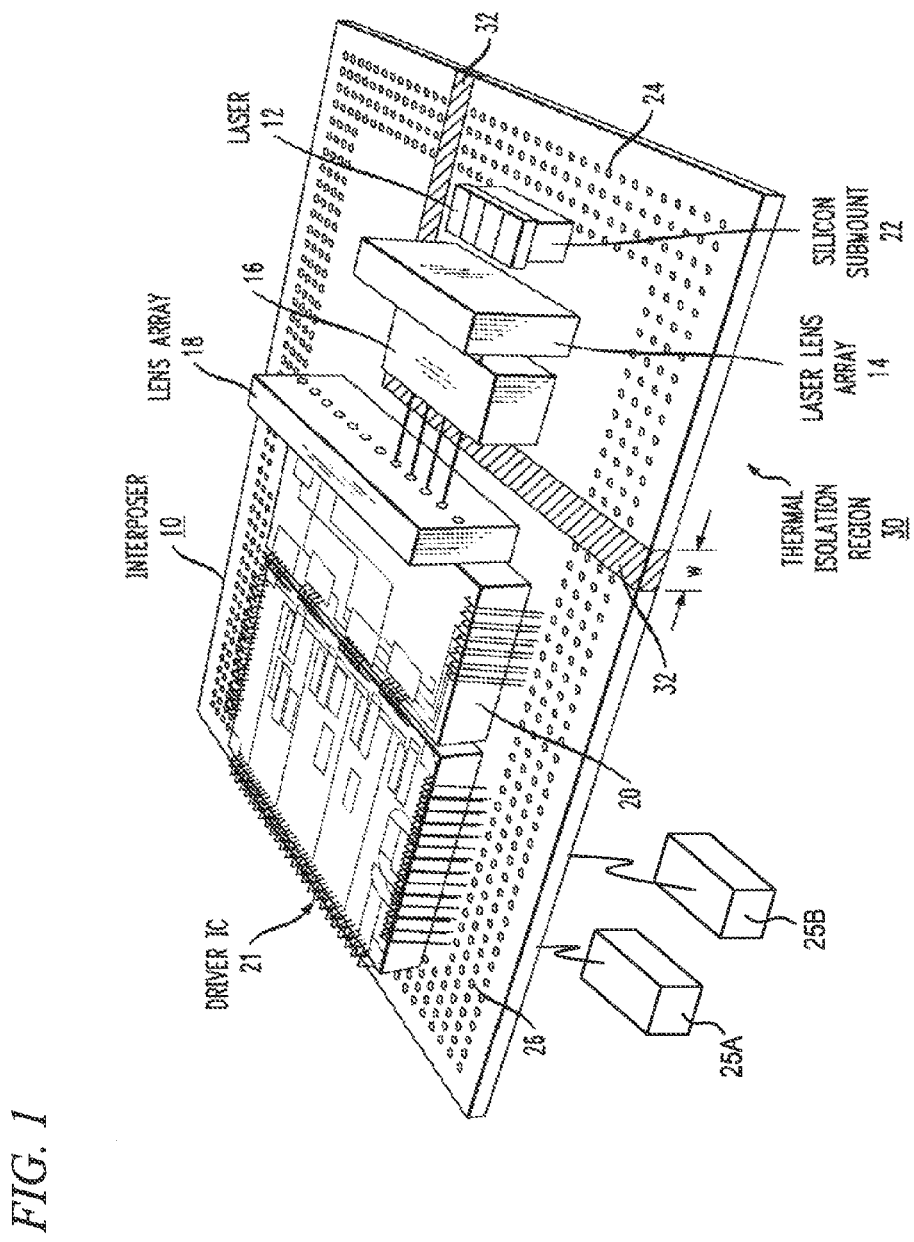
FIG. 1 is an isometric view of an opto-electronic module assembly of the present invention, illustrating the placement of optical and electronic components on an interposer substrate that is particularly configured to include a thermally isolated region that is designated for the placement temperature-sensitive components.

An arrangement for supporting components of an opto-electronic assembly comprises an interposer substrate for supporting a plurality of opto-electronic components that includes at least one temperature-sensitive opto-electronic component, the interposer substrate including a dielectric boundary strip formed through the thickness thereof and configured to define a region of the interposer substrate that is thermally isolated from the remainder of the assembly, with the at least one temperature-sensitive opto-electronic component located within the thermally isolated region.

Example Embodiments

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

Most commercially available opto-electronic components are positioned on optical platforms designed to operate at 25° C. Significantly better performance of some opto-electronic components is achieved at lower temperatures, such as 15° C. or less. However, traditional thermal management systems for opto-electronic modules, as described above, are limited in achieving low optical platform temperatures while supporting the high end of typical opto-electronic package operating temperature ranges. In some cases, these operational temperature ranges include environments in excess of 70°-80° C.

FIG. 1 is an isometric view of an opto-electronic module assembly of the present invention, illustrating the placement of optical and electronic components on an interposer substrate that is particularly configured to include a thermally isolated region that is designated for the placement temperature-sensitive components. As shown in FIG. 1, the arrangement utilizes an interposer substrate 10 that may comprise any suitable material, where silicon and glass materials are conventional choices for this purpose. In this particular configuration, the opto-electronic module assembly includes a laser diode array 12 that is a source of a set of propagating optical signals. A microlens array 14 is shown as placed in the optical output signal path from the laser diode array 12. An optical isolator 16 is positioned beyond the microlens array 14 and is used to prevent reflected optical signals from re-entering the laser diode array 12. The signal exiting the optical isolator 16 then passes through a microlens array 18 and enters a CMOS photonic chip 20. A separate electrical circuit 21, which operates in conjunction with the CMOS photonic chip 20, is included in this particular arrangement as placed upon and electrically coupled to the interposer substrate 10.

It is to be understood that this set of components is exemplary only, illustrating one particular arrangement optical and electronic components that may take advantage of the temperature control benefits associated with incorporating at least one thermally-isolated region within an interposer substrate in accordance with the present invention. Broadly speaking, any arrangement of optical and electronic components that are disposed on a common substrate and are sensitive to ambient temperature fluctuations may utilize the thermally-isolated interposer arrangement of the present invention.

In accordance with the present invention and shown in the arrangement of FIG. 1, a thermally-isolated region 30 is integrated as part of the interposer substrate 10, where the size of the region is selected to allow for placement of temperature-sensitive devices in this area and remain relatively unaffected by temperature fluctuations within other portions of the interposer substrate 10 and other components contained thereon. By creating this thermal isolation region, the operating temperature of devices such as laser diodes and the like can be controlled without needing to compensate for variations in the ambient temperature associated with other opto-electronic components in the system.

As shown in FIG. 1, the thermally-isolated region 30 is created by processing the material forming the interposer substrate 10 to create a dielectric boundary strip 32 that marks a demarcation between the area within which the temperature-sensitive component(s) are located and the remainder of the assembly. The specific properties of the dielectric material forming the dielectric boundary strip 32, such as material choice and width w are selected to minimize heat transfer between thermally-isolated region 30 and the remaining circuitry as included on the interposer substrate 10 while not significantly impacting the overall size of the interposer substrate 10. In one embodiment, silicon dioxide may be used as the dielectric material forming dielectric boundary strip 32.

In the particular embodiment as shown in FIG. 1, the laser diode array 12, the laser lens array 14 and the optical isolator 16 are all located within the thermally-isolated region 30. A submount 22 is also included in the arrangement as shown in FIG. 1, where the submount 22 is disposed underneath the laser diode array 12 and used to properly align the output beams from the laser diode array 12 with the laser lens array 14. A first plurality of conductive through-vias 24 is included within the thermally-isolated region 30 to provide for electrical connections between the devices contained within this region and circuitry disposed underneath the interposer substrate 10 (not shown). A second plurality of conductive through-vias 26 is also included in the assembly and, as shown in FIG. 1, is located in the areas of the interposer substrate 10 outside of the thermally-isolated region 30. The second plurality of conductive through-vias 26 is used to provide electrical connections between components such as photonic chip 20, electrical circuit 21 and various other operational components 25A, 25B that may be located underneath the interposer substrate 10.

The dielectric boundary strip 32 is shown as being formed through the complete thickness of the interposer substrate 10 and has a defined geometry (in terms of topology on the surface of the interposer substrate 10) to create a region that is electrically and thermally isolated from the remainder of the structure. As long as the material forming the dielectric boundary strip 32 functions as a thermal insulator, heat transfer between the area surrounding the laser diode array 12 and the remainder of the optical and electrical components of the assembly is minimized. The use of the thermally-isolated region 30 in accordance with the present invention allows for the integration of a light source (such as a laser or LED; in this case, the laser diode array 12) in an interposer-based assembly and provides for temperature control as needed for stable operation of the light source. While only a single thermally-isolated region is shown in this particular arrangement, it is to be understood that there may be particular situations or arrangements where two or more separate thermally-isolated regions may need to be formed within the interposer substrate.

Figure 2:
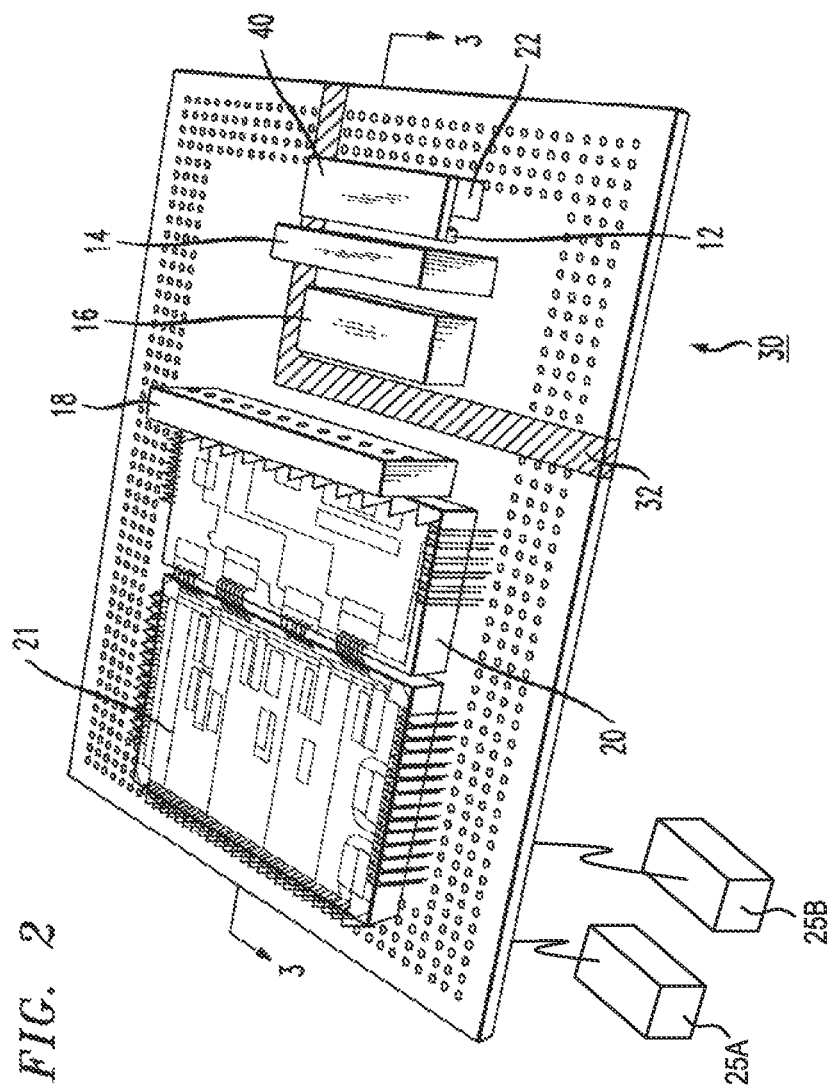
FIG. 2 illustrates the same arrangement as FIG. 1, in this case with a TE cooler included with the thermally-isolated components.

In one embodiment of the present invention, a thermoelectric (TE) cooler is used in conjunction with a light source disposed in the thermally-isolated region, where the TE cooler is used to control the operating temperature of the light source so to maintain optimal performance of the device, particularly in terms of its output signal power. FIG. 2 illustrates the same arrangement as FIG. 1, in this case with a TE cooler included with the thermally-isolated components. In particular, FIG. 2 shows a TE cooler 40 positioned above the laser diode array 12 and coupled thereto in a manner well-known in the art to monitor the ambient temperature in the area surrounding the laser diode array 12 and either increase or decrease the temperature, as need be, to maintain the operating temperature of the laser diode array 12 within an acceptable range.

Figure 3:
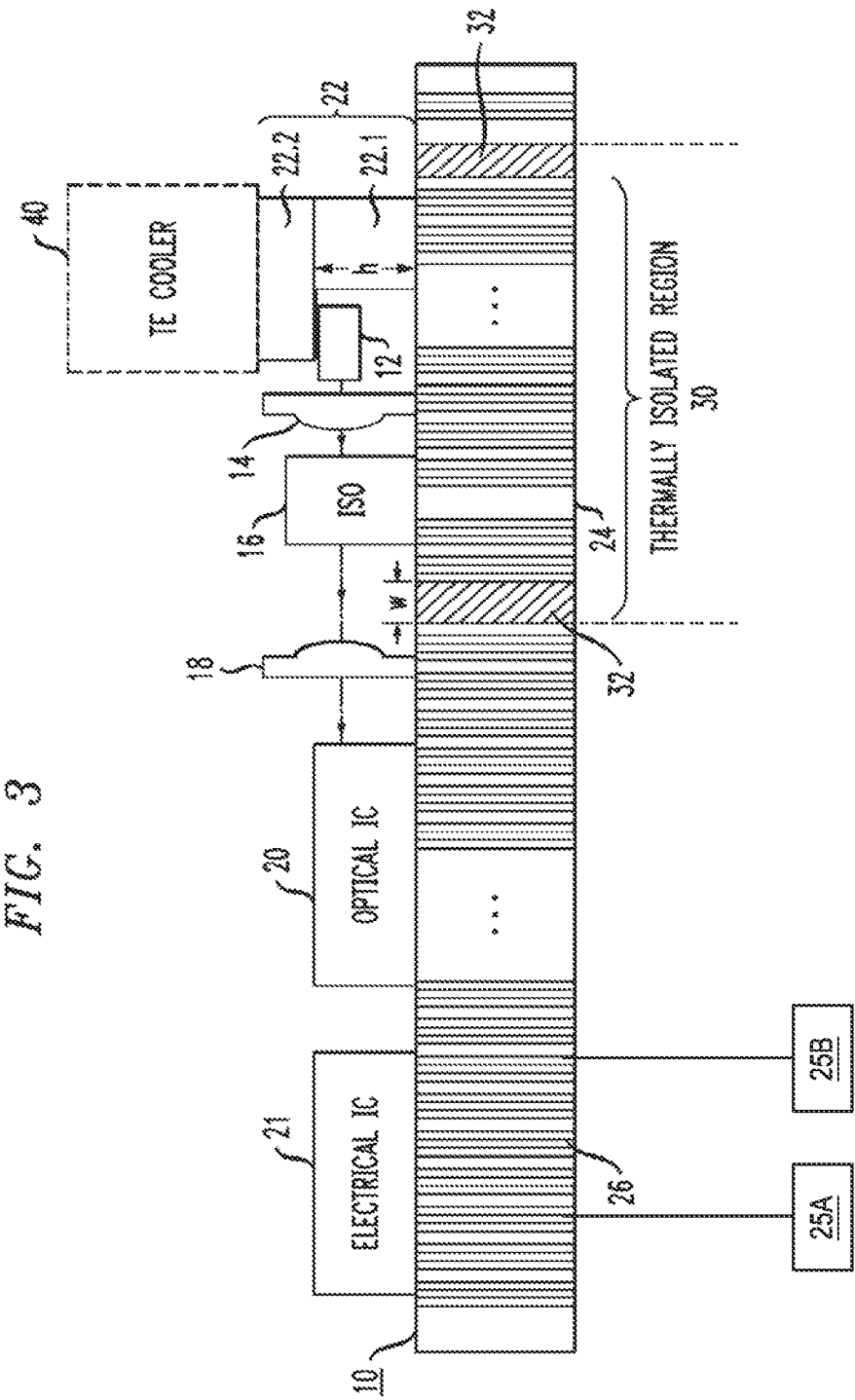
FIG. 3 is a cut-away side view of the assembly of FIG. 2, taken along line 3-3.

FIG. 3 is a cut-away side view of the assembly of FIG. 2, taken along line 3-3. The relative positions of TE cooler 40, the laser diode array 12 and the laser submount arrangement 22 are evident in this view. In this particular configuration, the laser submount arrangement 22 comprises a pair of elements in the form of a vertical alignment element 22.1 and a horizontal support element 22.2. The vertical alignment element 22.1 is configured to have a height h that will align the output facet of the laser diode array 12 with the optical axis of the laser lens array 14. The laser diode array 12 is shown as attached to the horizontal support element 22.2 at this pre-defined height, with the TE cooler 40 disposed on the opposite surface of horizontal support element 22.2.

Also shown in this view is a side portion of the dielectric boundary strip 32 of the thermally-isolated region 30 within which the laser diode array 12 and its associated components are situated. By virtue of integrated the dielectric boundary strip 32 within the interposer substrate 10 itself, heat transfer between components such as, for example, the photonic chip 20 and the laser diode array 12, is minimized. Isolating the temperature-sensitive laser diode array 12 within this protected area allows the TE cooler 40 to efficiently moderate the operating temperature of the laser diode array 12 without the need to compensate for temperature fluctuations associated with other components in the assembly.

Figure 4:
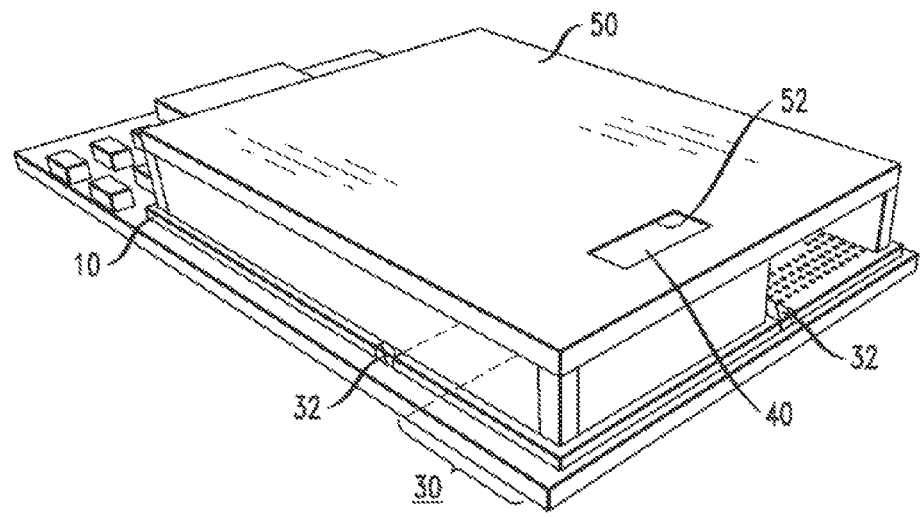
FIG. 4 shows an exemplary packaged interposer that includes an enclosing lid formed to comprise an opening to accommodate the position of the TE cooler.

In order to maintain the desirable properties of thermal management associated with the use of the TE cooler 40, it is preferable to provide an unimpeded thermal path between the TE cooler 40 and the outer surrounding environment. FIG. 4 shows an exemplary packaged interposer that includes an enclosing lid formed to comprise an opening to accommodate the position of the TE cooler. Referring to FIG. 4, a lid element 50 is shown as disposed over and attached to the interposer substrate 10. An opening 52 is formed within the lid element 50 in a location directly above the TE cooler 40. The presence of the opening 52 creates a thermal path that allows for unimpeded heat exchange between the enclosed laser diode array 12 (not visible in FIG. 4) and the surrounding environment via the operation of the TE cooler 40.

Figure 5:
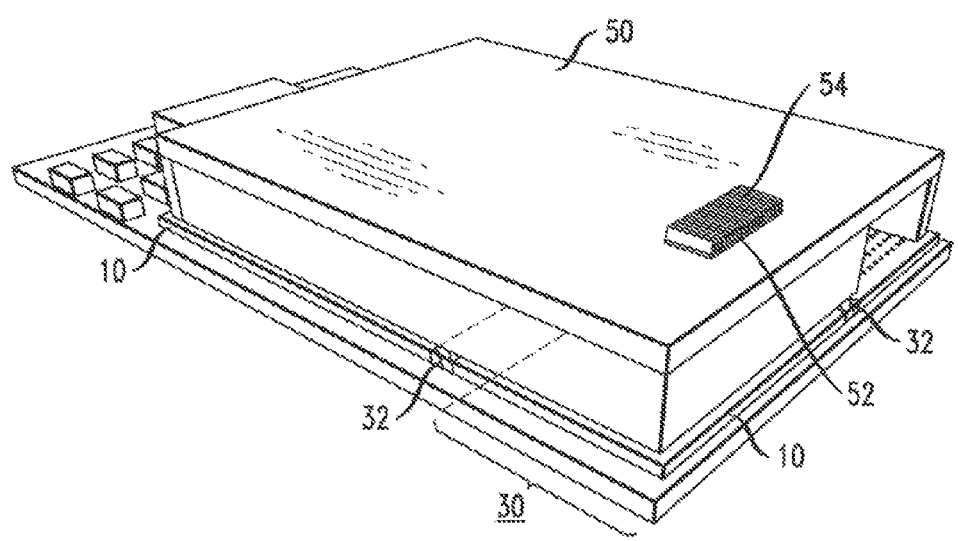
FIG. 5 illustrates another enclosed embodiment of the present invention.

FIG. 5 illustrates another enclosed embodiment of the present invention. In this case, the enclosure is formed to further comprise a heat sink 54 that is attached to the TE cooler 40 through the opening 52. The heat sink 54 is included to improve the heat transfer capabilities of the TE cooler 40, which may be required in arrangements where an included light source generates significant heat during operation.

One aspect of utilizing an interposer as part of a larger assembly is that electrical contacts are also made to the underside of the interposer and, at times, electronic components are contacted to the underside of the interposer (saving "space" of the overall arrangement by populating at least portions of both surfaces of the interposer). This advantage is utilized in the embodiment of the present invention as shown in FIG. 6, where FIG. 6 is an isometric view of an interposer including a thermally-isolated region, with a TE cooler coupled to the underside of the interposer.

Figure 6:
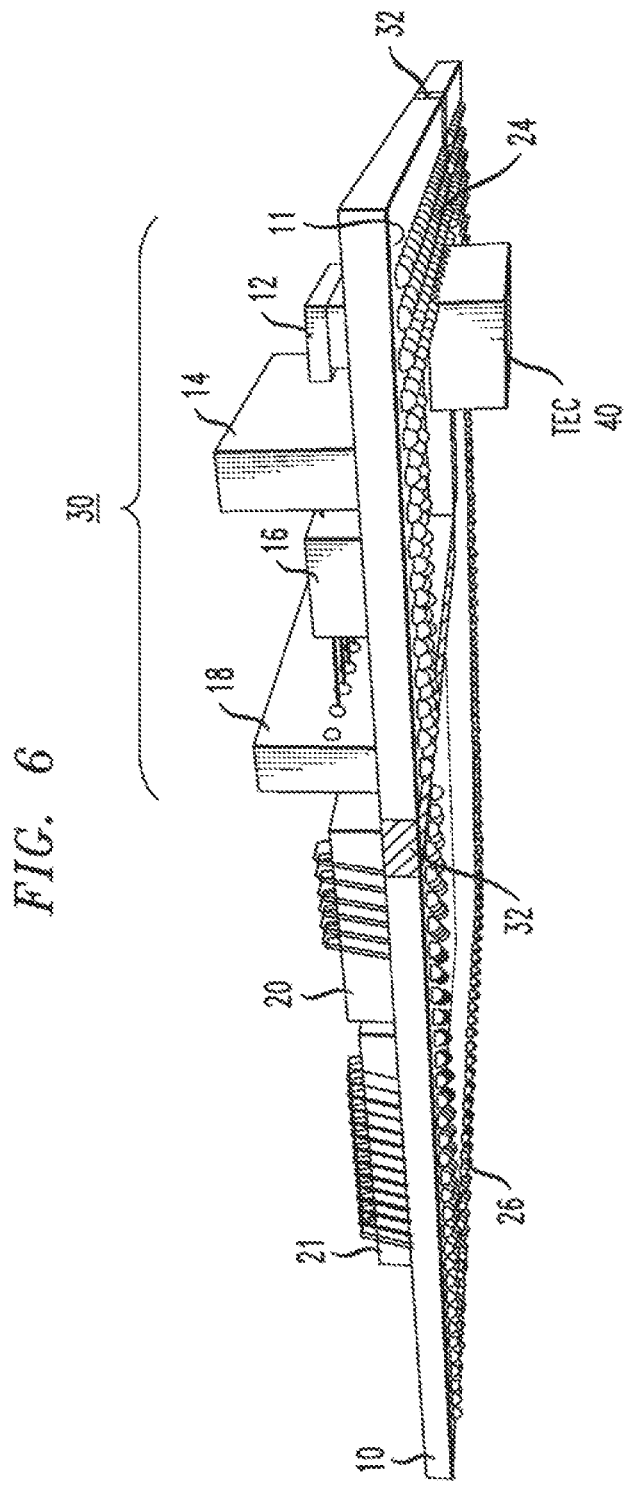
FIG. 6 is an isometric view of an interposer including a thermally-isolated region, with a TE cooler coupled to the underside of the interposer.

Referring to FIG. 6, the TE cooler 40 is shown as coupled to an underside 11 of the interposer substrate 10. Also clearly shown in this view is the plurality of through-vias 24 formed through the thickness of the interposer substrate 10. In accordance with this embodiment of the present invention, a set of through-vias 24 will provide the electrical connection between the TE cooler 40 and the laser diode array 12. The inclusion of the TE cooler 40 on the underside 11 of the interposer substrate 10 in this configuration provides for a lower profile of the overall arrangement when compared to the embodiment of FIG. 2, where the TE cooler 40 extends above the height of the other optical and electronic components on the interposer substrate 10 (evident in the view of FIG. 3). The location of the dielectric boundary strip 32 of the thermally-isolated region 30 is also shown in FIG. 6.

While the invention has been described in terms of different embodiments, those skilled in the art will recognize that the invention can be practiced with various modifications that are considered to fall within the spirit and scope of the invention as best defined by the claims appended hereto. In particular, the interposer substrate itself may be formed of any suitable material, where silicon and glass are considered as two exemplary materials that may be used. The dielectric boundary strip may also be formed of any suitable material, where in one case silicon dioxide may be used. Moreover, while only a single thermally-isolated region is shown in the drawings, it is to be understood that multiple regions of similar form may be created at other locations on the interposer surface. The use of multiple thermally-isolated regions may be required when a large number of temperature-sensitive devices cannot be co-located without causing problems in terms of providing the proper interconnections between the various components.

Furthermore, while the specification has been described in language specific to structural features and/or methodological acts, the claims are not limited to the features or acts described above. Rather, the specific features and acts described above are disclosed as examples for embodiments of the invention.

We claim:

1. An opto-electronic (OE) device, comprising:
   a substrate including a first portion, a second portion, and a dielectric boundary strip attached to the first and the second portions;
   at least one electrical component disposed at the first portion; and
   at least one temperature-sensitive opto-electronic component disposed at the second portion and configured to be optically coupled to the at least one electrical component,
   wherein the dielectric boundary strip includes a thermal conductivity less than a thermal conductivity of the first and the second portions.

2. The OE device of claim 1, wherein the dielectric strip is disposed between the first and the second portions.

3. The OE device of claim 2, wherein the dielectric boundary strip extends between opposite sides of the substrate.

4. The OE device of claim 3, wherein the second portion comprises a plurality of second conductive through-vias which couple the at least one temperature-sensitive opto-electronic component to a photonic chip.

5. The OE device of claim 1, wherein the at least one temperature-sensitive opto-electronic component comprises a laser diode array.

6. The OE device of claim 5, further comprising a thermo-electric cooler supported by the substrate.

7. The OE device of claim 6, wherein the thermo-electric cooler is coupled to the laser diode array by at least one of the plurality of second conductive through-vias formed within the substrate.

8. The OE device of claim 6, further comprising a support element to mount the thermo-electric cooler and the laser diode array to the second portion of the substrate.

9. The OE device of claim 8, further comprising an enclosure lid attached to the substrate and enclosing the laser diode array of the at least one temperature-sensitive opto-electronic component, wherein the enclosure lid includes an opening establishing a thermal path between the laser diode array and an environment outside of the enclosure lid.

10. The OE device of claim 9, further comprising a heat sink attached to the thermo-electric cooler through the opening.

11. The OE device of claim 1, wherein the dielectric boundary strip comprises silicon dioxide.

12. The OE device of claim 1, wherein the at least one electrical component comprises at least one of: a microlens array, a photonic chip, and an electrical circuit.

13. The OE device of claim 1, wherein the dielectric boundary strip extends between adjacent sides of the substrate.

14. The OE device of claim 1, wherein the dielectric boundary strip extends through a thickness of the substrate.

15. A method of creating a substrate, comprising:
   integrally forming a dielectric boundary strip as part of the substrate, the dielectric boundary strip defining a boundary between first and second portions of the substrate; and
   creating first and second interfaces located respectively at the first and the second portions of the substrate, the first and the second interfaces configured to be coupled respectively to at least one temperature-sensitive opto-electronic component and at least one electrical component,
   wherein the dielectric boundary strip has a thermal conductivity less than a thermal conductivity of the first and the second portions.

16. The method of claim 15, wherein the forming the dielectric boundary strip includes forming a silicon dioxide boundary strip through a thickness of the substrate.

17. The method of claim 15, wherein the substrate comprises silicon.

18. The method of claim 15, wherein the creating the first and the second interfaces comprises respectively creating first and second through-vias each including an electrically-conductive material through a thickness of the substrate.

19. The method of claim 15, wherein the integrally forming includes integrally forming a plurality of dielectric boundary strips at separate locations integral with the substrate.

20. A method of creating an opto-electronic device having a substrate, comprising:
   electrically coupling at least one electrical component to a plurality of first electrical interfaces at a first portion of the substrate;
   electrically coupling at least one temperature-sensitive opto-electronic component to a plurality of second electrical interfaces at a second portion of the substrate; and
   optically coupling the at least one electrical component to the at least one temperature-sensitive opto-electronic component,
   wherein a dielectric boundary strip includes a thermal conductivity less than a thermal conductivity of the first and the second portions.

* * * * *